US007351292B2

(12) United States Patent  
Evers et al.

(10) Patent No.: US 7,351,292 B2
(45) Date of Patent: Apr. 1, 2008

(54) ASSEMBLY FOR PROCESSING SUBSTRATES

(75) Inventors: Marinus F. J. Evers, Heeze (NL); Peter Briër, Eindhoven (NL); Leonardus P M Clijsen, Eindhoven (NL)

(73) Assignee: OTB Group B.V., Eindhoven (NL)

( * ) Notice: Subject to any disclaimer, the term of this patent is extended or adjusted under 35 U.S.C. 154(b) by 379 days.

(21) Appl. No.: 10/442,181

(22) Filed: May 21, 2003

(65) Prior Publication Data

US 2004/0049308 A1    Mar. 11, 2004

(30) Foreign Application Priority Data

May 21, 2002   (NL)   .................................... 1020633

(51) Int. Cl.
- C23C 16/00 (2006.01)
- C23C 14/00 (2006.01)
- C23F 1/00 (2006.01)
- B65G 54/02 (2006.01)

(52) U.S. Cl. .................. 118/719; 118/695; 156/345.24; 156/345.31; 156/345.32; 204/298.25; 414/939

(58) Field of Classification Search ................ 118/719; 156/345.31, 345.32; 414/939; 204/298.26
See application file for complete search history.

(56) References Cited

U.S. PATENT DOCUMENTS 3,521,765 A    7/1970 Kauffman et al.
4,042,128 A *  8/1977 Shrader ....................... 414/287
4,624,617 A * 11/1986 Belna .......................... 414/347
5,086,729 A *  2/1992 Katagiri ...................... 118/729
5,288,329 A *  2/1994 Nakamura et al. .......... 118/729
5,474,611 A * 12/1995 Murayama et al. ... 118/723 VE
5,641,054 A *  6/1997 Mori et al. .................. 198/619
5,881,649 A    3/1999 Hasegawa et al.
6,358,377 B1 * 3/2002 Schloremberg et al. ...................... 204/192.12
2003/0047416 A1* 3/2003 Zimmer et al. .......... 198/339.1

FOREIGN PATENT DOCUMENTS

DE           20100639 U1 *  4/2001
WO       WO 01/06030 A1     1/2001

* cited by examiner

Primary Examiner—Karla Moore
(74) Attorney, Agent, or Firm—Pillsbury Winthrop Shaw Pittman LLP

(57) ABSTRACT

An assembly for processing substrates, which processing comprises a vacuum deposition process, such as, for instance, sputtering, CVD or PECVD, which vacuum deposition process is carried out in at least one process chamber, the assembly being provided with a conveying device for moving the substrates from a vacuum lock to a process chamber, the conveying device, which extends in a vacuum space, permitting a continuous conveyance of a substrate adjacent the at least one process chamber and permitting an intermittent conveyance adjacent at least the at least one vacuum lock.

55 Claims, 11 Drawing Sheets

ASSEMBLY FOR PROCESSING SUBSTRATES

CROSS REFERENCE TO RELATED APPLICATIONS

This application claims priority to the Netherlands patent application no. 1020633 filed May 21, 2002, the entire contents of which is incorporated by reference in its entirety.

This invention relates to an assembly according to the preamble of claim 1.

Such an assembly is known, for instance, from applicant's international patent application WO 02/04697.

The conveying device is there formed by a disk on which a number of substrates can be placed. During the introduction of a substrate into the vacuum chamber or the removal of a substrate from the vacuum chamber via a vacuum lock, the disk must stand still. This has as a consequence that during loading and unloading the substrate situated adjacent the process chamber likewise stands still. In vacuum deposition, however, it is often preferable to advance the substrate during the vacuum deposition process. The advancement of the substrate through the process chamber leads to the application of a layer of better uniformity. The known apparatus is not suited for moving a substrate through or along a process chamber, because the conveying system imposes a standstill of the substrate.

The object of the invention is to improve an assembly of the type described in the preamble, such that the above-outlined problem is thereby solved, and to that end the invention provides an assembly that is characterized by the features of claim 1.

Such an assembly has the advantage that the substrates can be moved along the process chamber in which the vacuum deposition takes place, while elsewhere in the assembly a substrate can be introduced into the vacuum space or can be removed therefrom. This yields a better uniformity of the layer thickness formed in the vacuum deposition process.

It will be clear that the term vacuum should not be construed as absolute vacuum. Indeed, the vacuum deposition does not take in absolute vacuum as well. In a PECVD or CVD-process a fluid such as a gas is introduced in the process chamber. The skilled person knows what is meant by vacuum, namely, conditioned circumstances, i.e. circumstances which are desired during the processing and/or transport of the substrates and which can be created by virtue of the fact that the space in which the conveying device extends is closed off from the environment. These conditioned circumstances also include a vacuum space filled with inert gas.

According to a further elaboration of the invention, the assembly is characterized by the features of claim 2.

Due to the carriers being drivable independently of each other, some carriers in the assembly can be advanced continuously while other carriers in the assembly are advanced intermittently. In the path in which the carriers are advanced continuously, they can be coupled to each other, so that a closed series of carriers can be advanced under one or a number of process chambers arranged behind each other. This prevents the rails disposed under the process chambers from being contaminated by the vacuum deposition process. Moreover, this leads to a better efficiency of the vacuum deposition, since virtually all particles released during the deposition end up on substrate surface and hence contribute to the formation of a desired layer on the substrate surface.

According to an alternative further elaboration of the invention, the assembly is characterized by the features of claim 18.

Such an embodiment is relatively simple and hence economically advantageous. Specifically for mass production, this variant offers advantages, since the conveying speed of the main conveyor can be accurately tuned to the vacuum deposition process and the supply and discharge conveyors can be accurately adjusted accordingly, yielding a highest possible production. The flexibility of such an assembly, however, is considerably less than that of the embodiment with the carriers that are drivable independently of each other.

The advantage of the embodiment with the independently drivable carriers is that the carriers can be individually pre-heated to a temperature desired for the respective substrate. Varying the pre-heating per substrate is therefore one of the possibilities. Moreover, the manner in which the substrate is cooled off can be varied individually in the carrier embodiment.

This is because the traveling speed of the carriers, and hence the time during which a respective carrier remains in a heating path and a cooling path, can be varied. Moreover, the layer or layers to be applied during the vacuum deposition processes can be varied in thickness by varying the traveling speed of a respective carrier in that path.

Further elaborations of the invention are described in the subclaims and will be further clarified hereinafter on the basis of two exemplary embodiments, with reference to the drawing.

Figure 1:
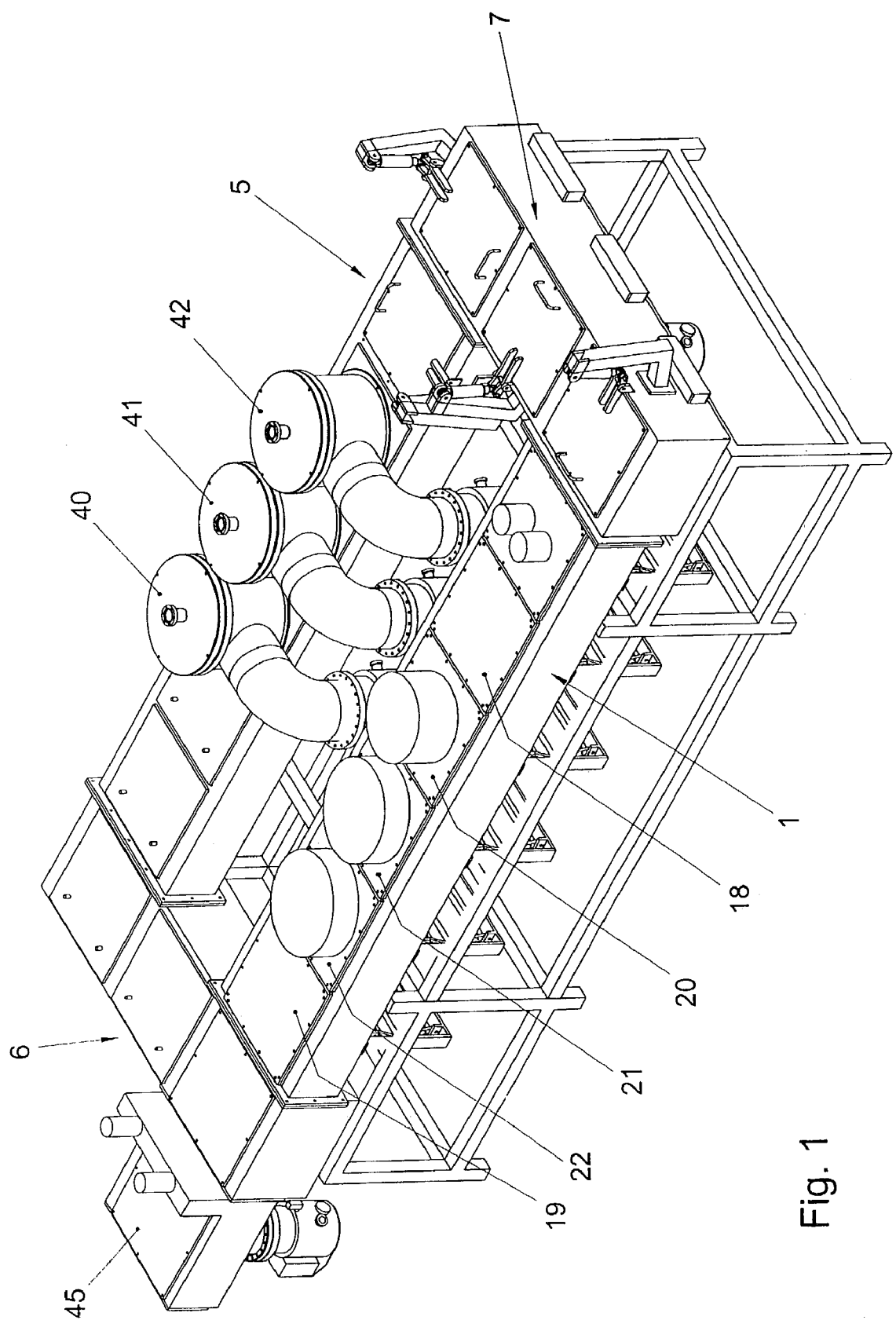
FIG. 1 shows a perspective view of a first exemplary embodiment of the assembly according to the invention.
Figure 2:
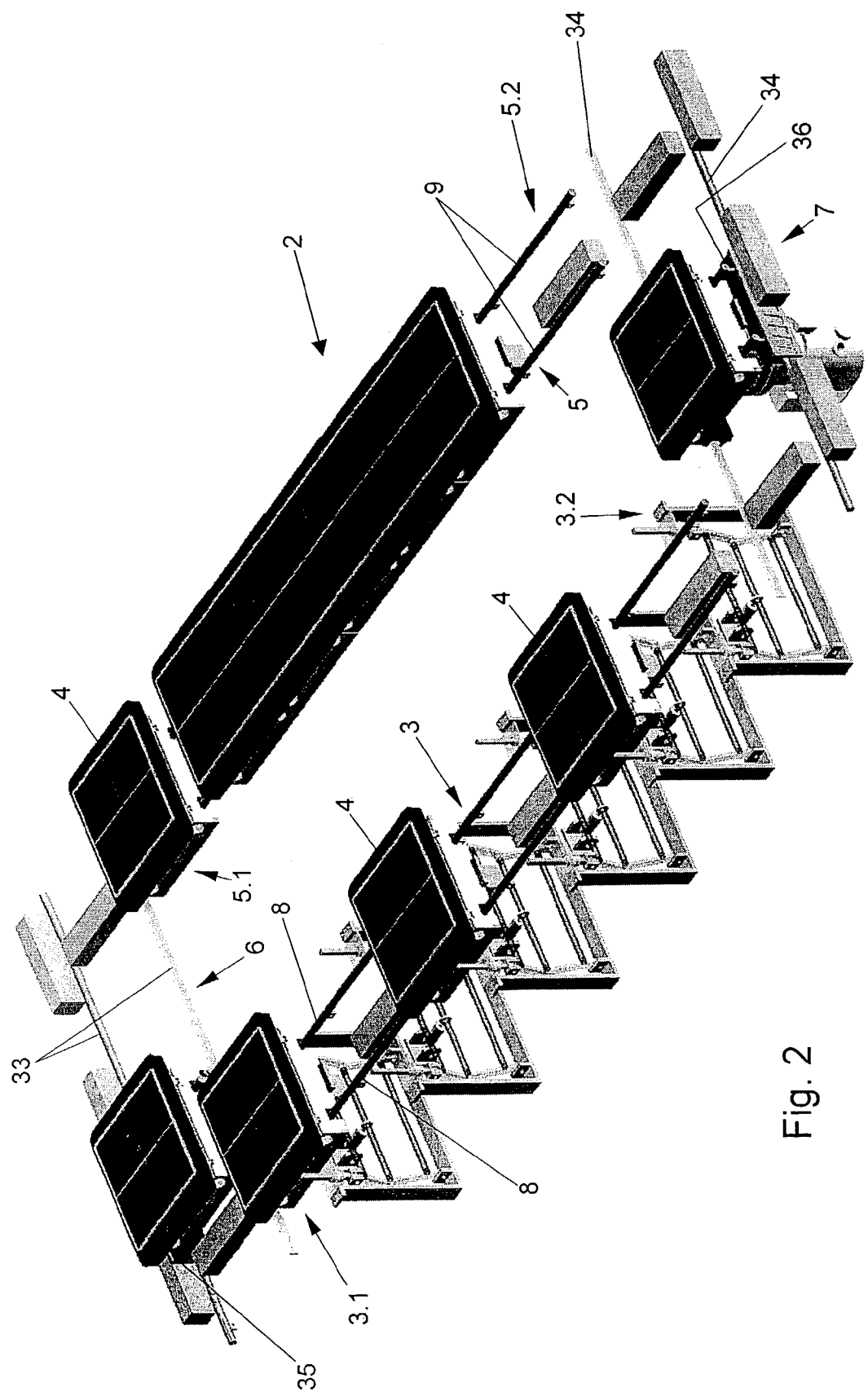
FIG. 2 shows a perspective view similar to FIG. 1, with omission of the plating of the vacuum space and the process chambers as well as the vacuum locks, so that the conveying device is visible.
Figure 3:
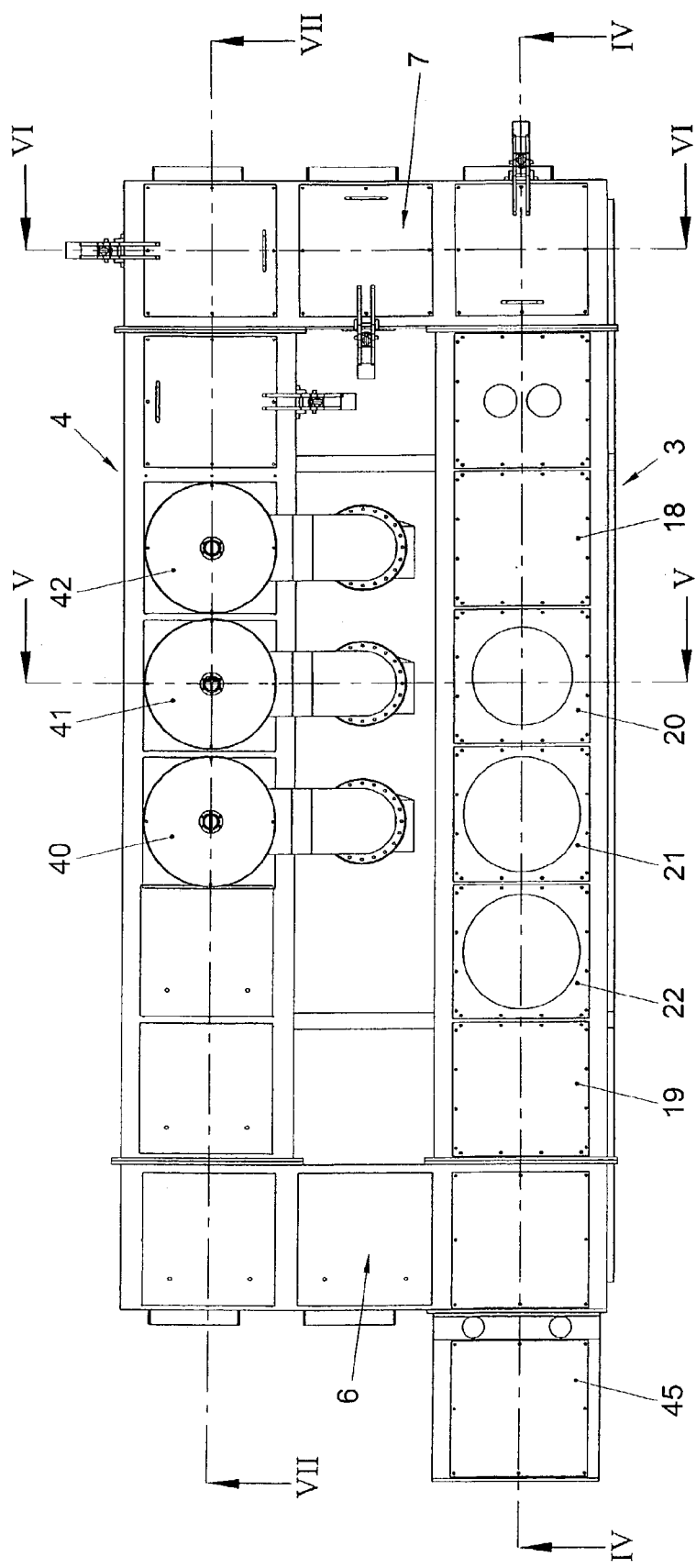
FIG. 3 shows a top plan view of the assembly represented in FIG. 1.

The exemplary embodiment of the assembly represented in FIG. 1 is provided with a vacuum space 1 in which extends a conveying device 2. The conveying system 2, which is shown in more detail in FIG. 2, comprises a first path 3 in which the carriers 4 advance intermittently. The conveying system 2 is further provided with a second path 5, in which the carriers 4 advance continuously. A discharge end 3.1 of the first path 3 is connected via a third path 6 with a supply end 5.1 of the second path 5. A discharge end 5.2 of the second path 5 is connected via a fourth path 7 with a supply end 3.2 of the first path 3. In the second, third and fourth paths 5, 6, and 7, respectively, the carriers 4 advance continuously. In the first path 3 the carriers 4 advance intermittently. In the first path 3 and the second path 5 extend rails 8 and 9, respectively. The carriers 4, as is clearly represented in FIG. 8, are provided with a bearing 10, 11 through which the carrier 4 is mobile over the rails 8, 9.

Figure 4:
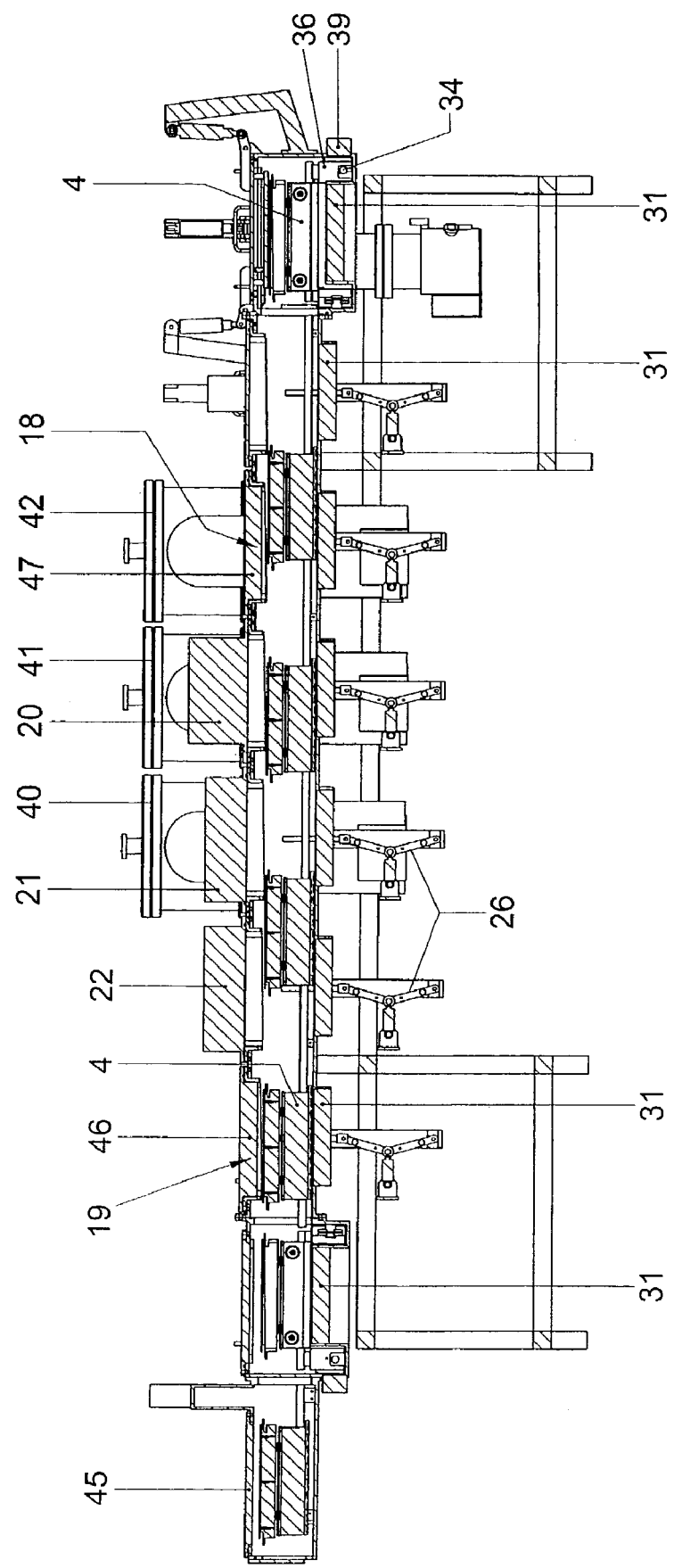
FIG. 4 shows a sectional view along line IV-IV in FIG. 3.
Figure 5:
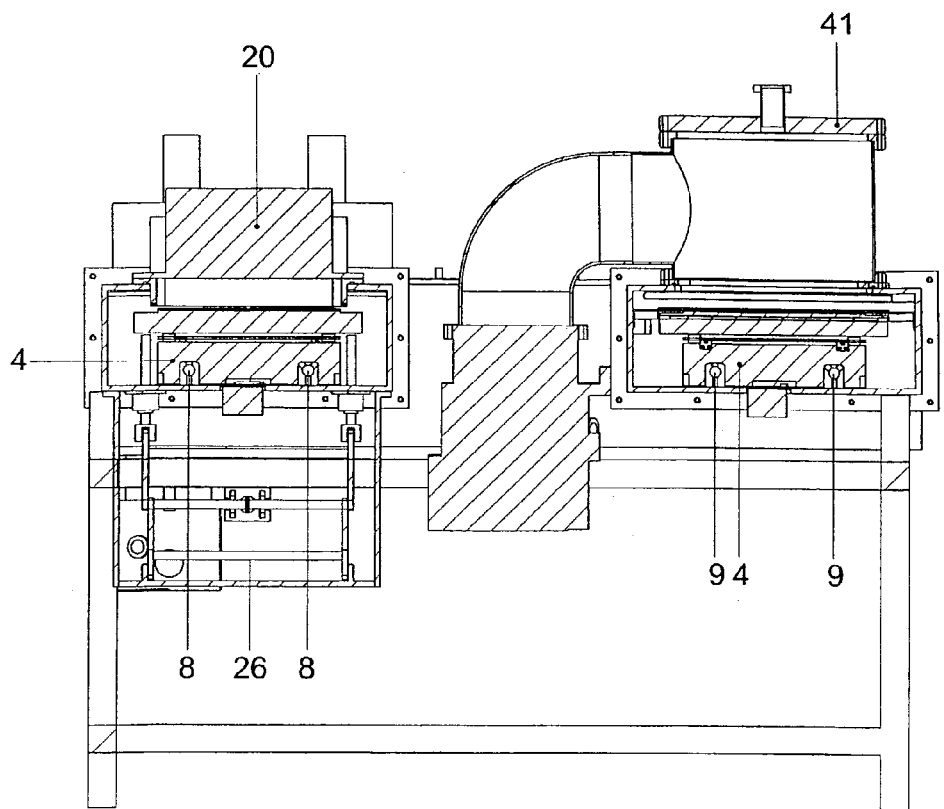
FIG. 5 shows a sectional view along line V-V in FIG. 3.
Figure 6:
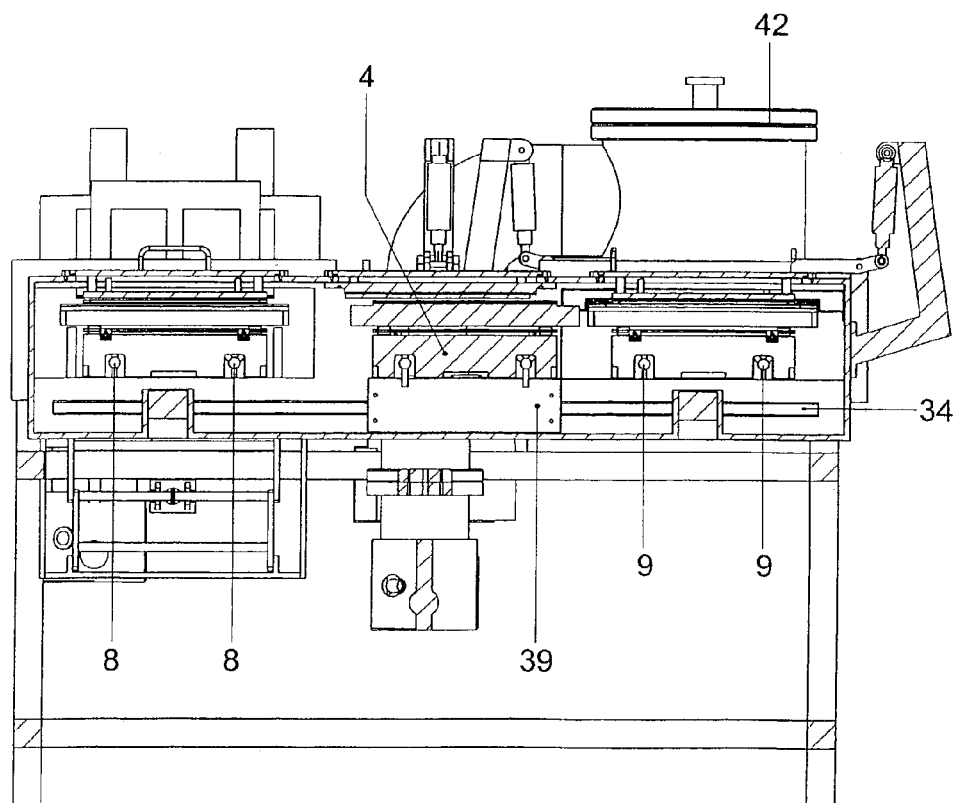
FIG. 6 shows a sectional view along line VI-VI in FIG. 3.
Figure 8:
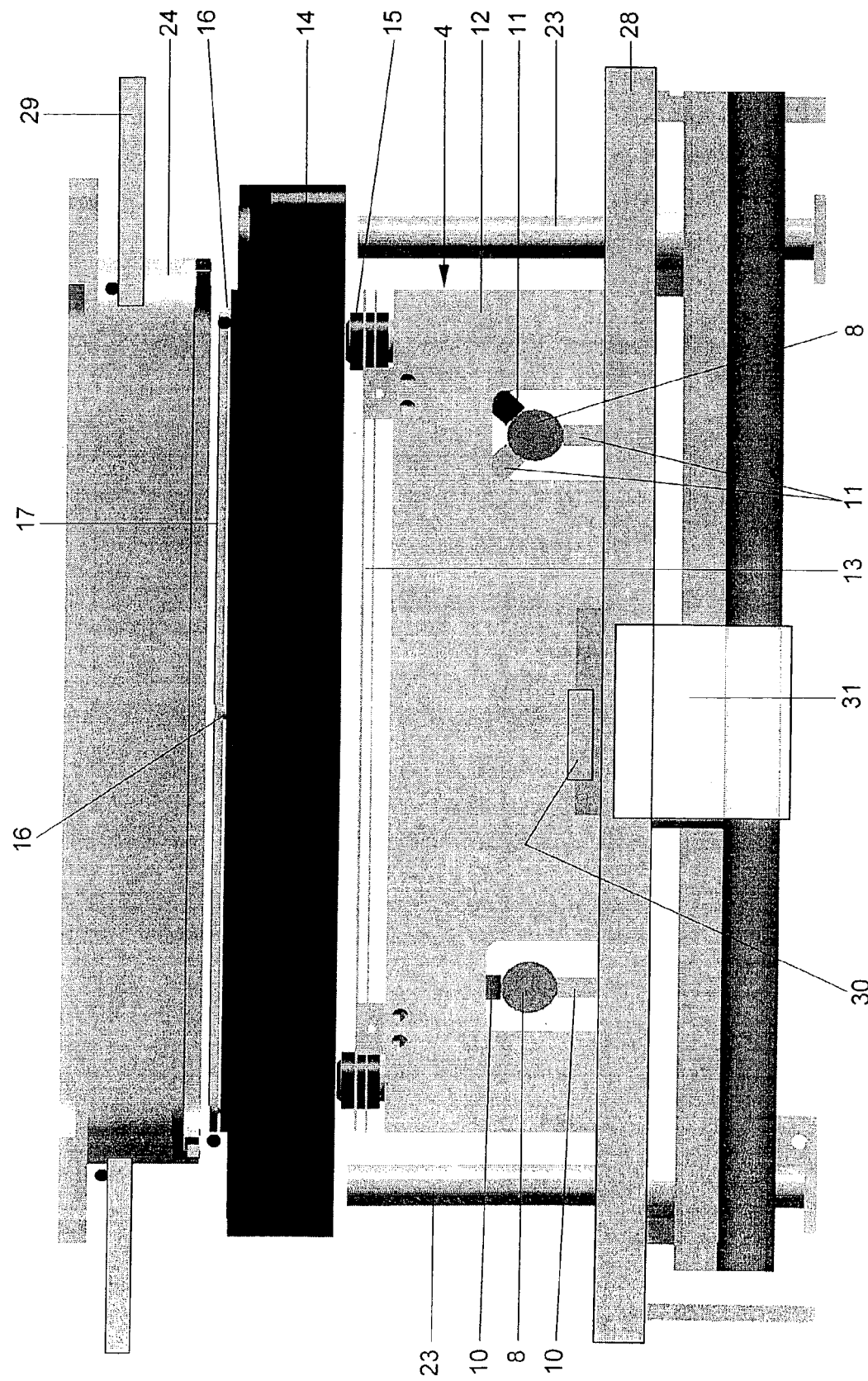
FIG. 8 shows in cross section a carrier adjacent a vacuum lock.
Figure 9:
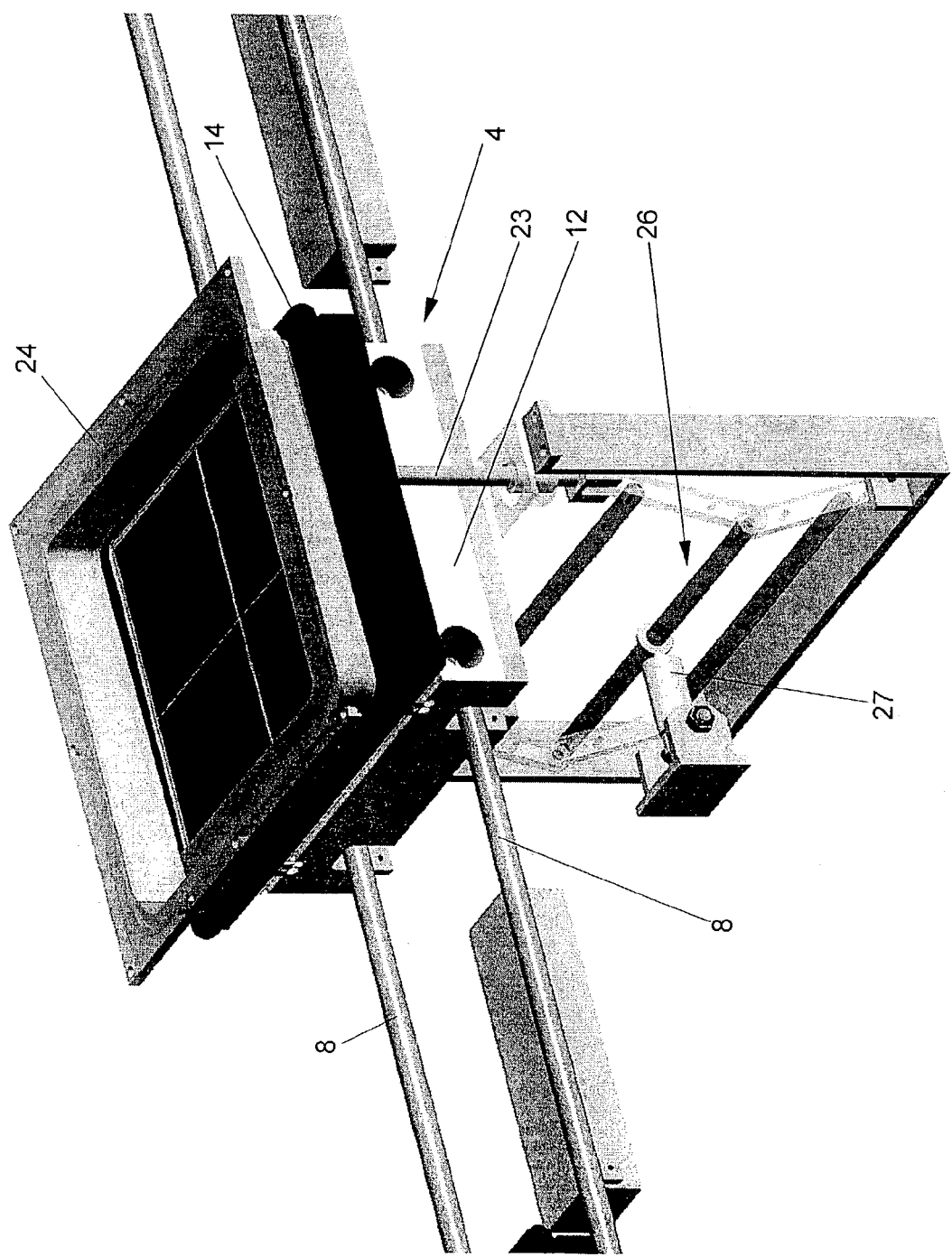
FIG. 9 shows a perspective view of a carrier adjacent a vacuum lock.

As is clearly shown in FIG. 8, the carrier 4 is provided with a base part 12 which is connected via a plane-parallel spring 13 with an intermediate part 14. Normally, the intermediate part 14 rests on supports 15 which are connected with the base part 12. The plane-parallel spring 13, however, allows a vertical displacement of the intermediate part 14 relative to the base part 12. Arranged on the intermediate part 14, via a thermally insulating connection 16, is a substrate carrier part 17 in which a heating element is included. The heating element can heat a substrate disposed on the substrate carrier part 17 to a temperature of about 450° C. Owing to the thermally insulating connection 16, which may be formed, for instance, by a three point support having a very small contact surface, the intermediate part 14 will acquire a temperature of about 120° C. at most. Since the connection between the intermediate part 14 and the base part 12 has been effected via the plane-parallel spring 13, a substantial thermal insulation can be effected there too, so that the base part will reach a temperature of at most about 60° C. Adjacent the vacuum locks 18, 19—and, for that matter, also adjacent a station 20 in which residual material can be sucked up from the substrate carrier part 17, and stations 21, 22 in which the substrate carrier part 17 in the vacuum space can optionally undergo a cleansing etching operation—press-up elements 23 are present, by means of which the intermediate part 14 of the carrier part 4 can be pressed up. Thus, the intermediate part 14 can be pressed against a lower edge of a limitation 24 of a vacuum lock opening, so that the substrate carrier part 17 is situated in the opening of the vacuum lock 18, 19 and is insulated from the vacuum space 1. Thereafter the cover 46, 47 (see FIG. 4) can be taken from the limitation 24 of the vacuum lock 18, 19, so that the substrates can be removed from the substrate carrier part 17. It will be clear that a considerable force is required to keep the intermediate part 14 pressed against the lower edge of the limitation 24 when the cover 46, 47 has been removed from the limitation 24 of the vacuum lock 18, 19, since under those circumstances the atmospheric pressure will tend to push the intermediate part 14 down forcefully. To resist this force, in the present exemplary embodiment, the press-up elements 23 are moved up and down by means of a toggle joint lever system 26. The toggle joint lever system 26 is clearly visualized in FIG. 9 and is energized by a piston/cylinder assembly 27.

Figure 10:
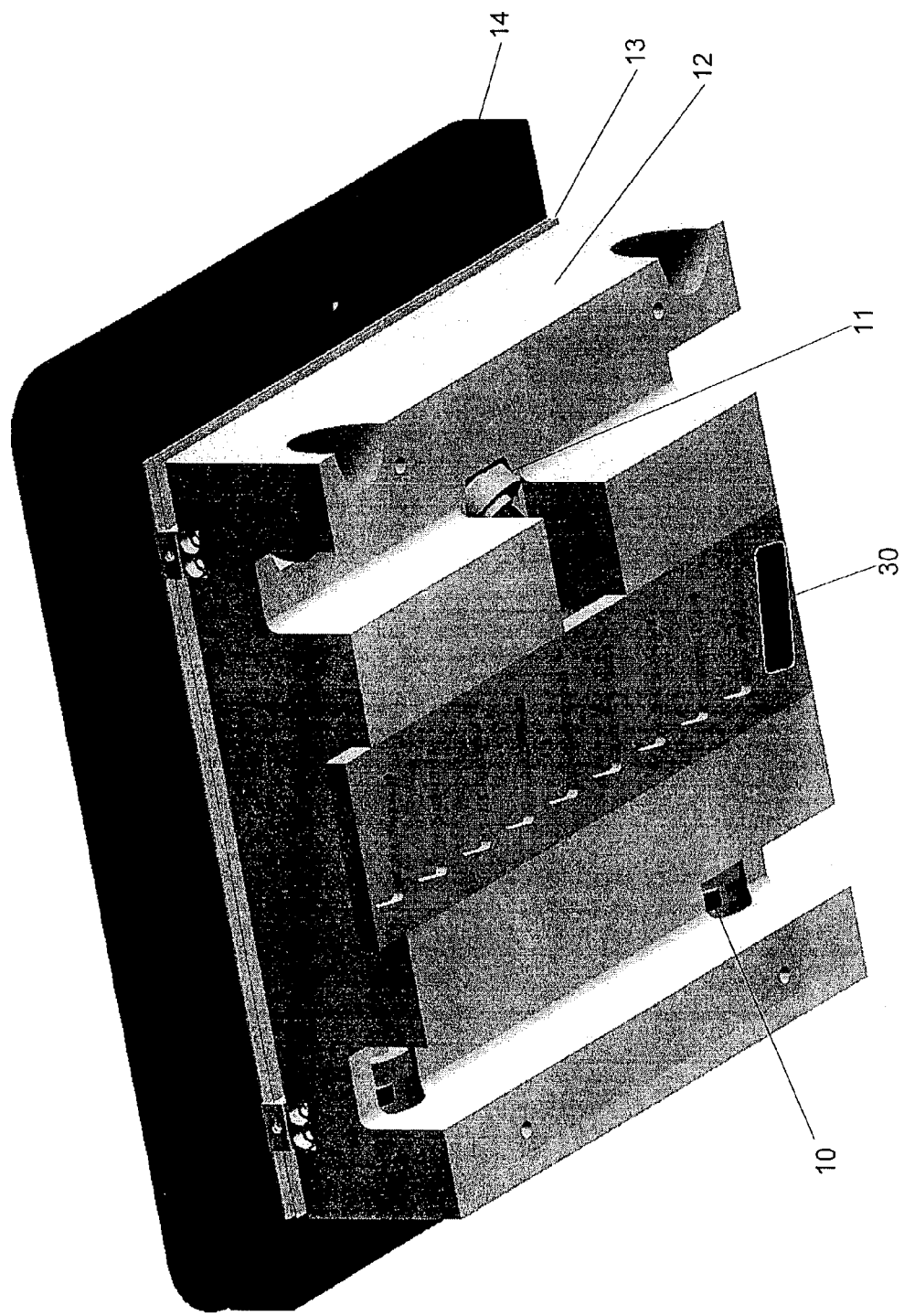
FIG. 10 shows a perspective bottom view of a carrier.

FIG. 8 further shows a bottom wall 28 and a top wall 29 which bound the vacuum space 1. In the base part 12 of the carrier 4 a series of magnets 30 are included. This series of magnets 30 is also clearly visible in FIG. 10. The magnets 30 are part of the drive of the carrier 4. Outside the vacuum space 1, under the bottom wall 28, a series of coils 31 are arranged. The coils 31 can be excited such that the carriers 4 can be advanced over the rails 8, 9, respectively, with any desired speed. To enable the conveyance of the carriers 4 in the third and fourth paths 6, 7, respectively, these paths are provided with cross rails 33, 34, respectively. Over these cross rails 33, 34, a cross conveyance carrier 35, 36, respectively, is mobile.

Figure 11:
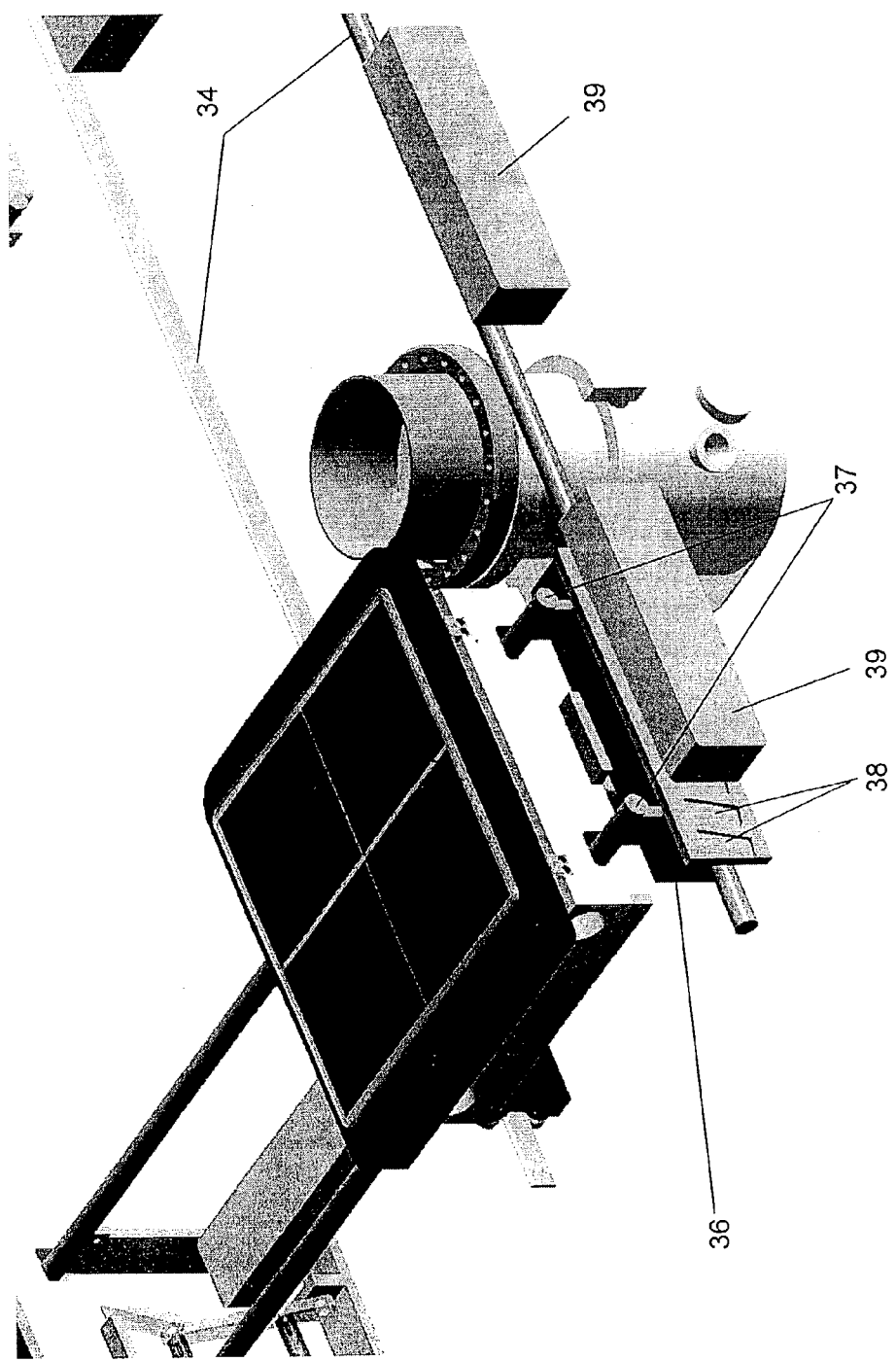
FIG. 11 shows a perspective view of a carrier adjacent the transition between the fourth path and the first path.

The cross conveyance carrier 36 of the fourth path 7 is represented in more detail in FIG. 11. It is clearly visible that the cross conveyance carrier 36 is provided with rail parts 37 extending perpendicularly to the cross rails 34 and which can be aligned with the rails 8, 9, respectively, of the first and second paths 3, 5, respectively. The cross conveyance carrier 36 is also provided with magnets 38 cooperating with coils 39. The coils 39 are arranged outside the housing of the vacuum space 1.

Figure 7:
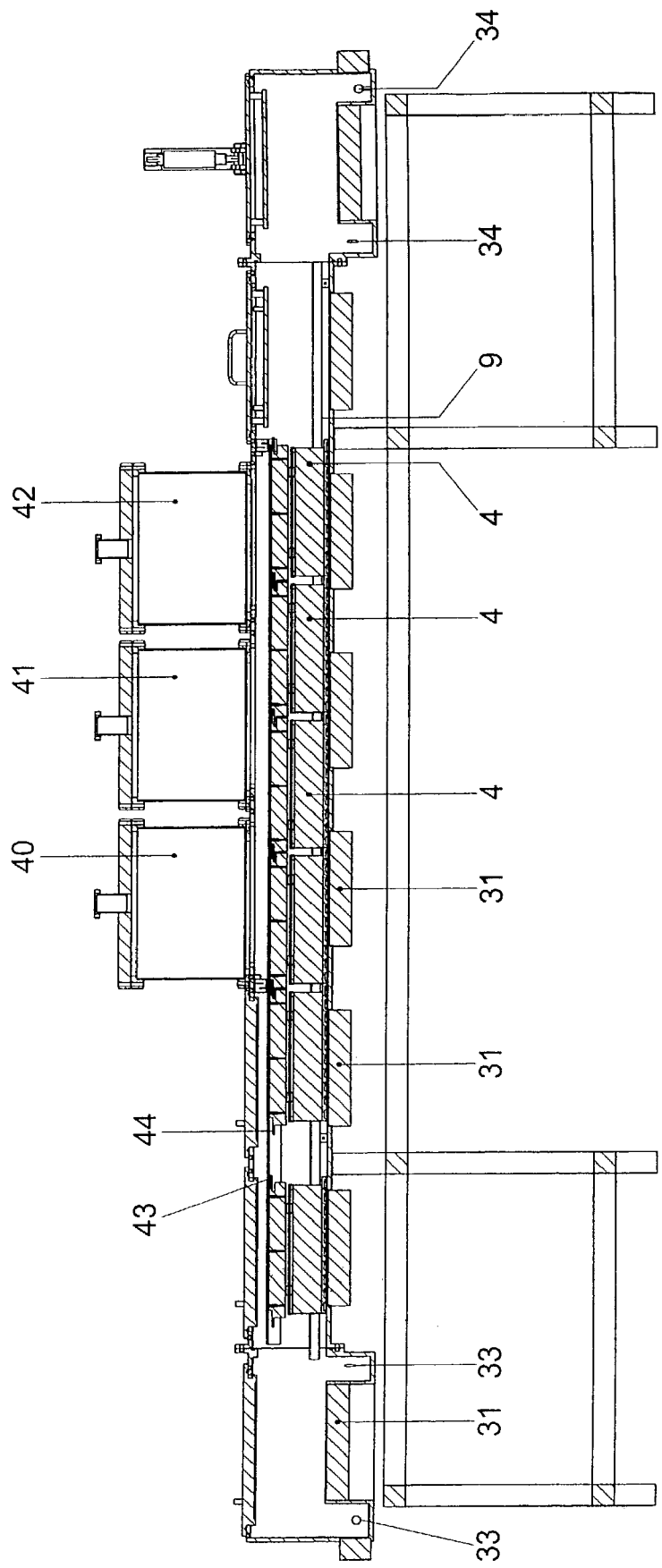
FIG. 7 shows a sectional view along line VII-VII in FIG. 3.

Referring to FIG. 1, it is further observed that after the vacuum lock 19 for introducing a substrate into the vacuum space a carrier 4 is moved to the third path 6. In the third path, carrier 4 is moved with the aid of the cross conveyance carrier 35 in the direction of the second path 5. In the third path 6 pre-heating lamps are arranged, by means of which the substrate can be pre-heated to a temperature of about 300° C. Next, the carrier 4 moves into the second path 5 and there a further heating of the substrate to about 400° C. takes place. This further heating takes place with the aid of the heating element contained in the substrate carrier part 17. The substrate proceeds to pass a number of process chambers 40, 41, 42 in which a number of vacuum deposition processes take place. One can here think of, for instance, sputtering or a PECVD process. As is clearly visible in FIG. 2 and FIG. 7, the carriers link up with each other, so that the substrate carrier parts 17 of the successive carriers 4 form a continuous surface. This prevents the vacuum deposition from contaminating the conveying device, such as, for instance, the rails 9. To reduce such contamination still further, each intermediate part 14 is provided at an upstream end with a nose 43 and at a downstream end with a recess 44 in which the nose 43 is receivable. Thus a kind of labyrinth is formed which prevents particles that come from the vacuum deposition process from contaminating the transport rails 8, 9 or the base parts 12 with the bearing 10, 11 contained therein. Downstream of the process chambers 40, 41, 42, in the second and fourth paths 5 and 7, respectively, a cooling of the substrate to about 150° C. takes place. Adjacent a supply end of the first path 3, further cooling means are provided, for cooling the substrates further to 60° C. The further cooling means can comprise rinsing means 44 for causing the substrate to be circumfused by a gas, such as, for instance, nitrogen. Downstream of these further cooling means 44, a vacuum lock 18 is disposed for taking the substrate out of the assembly. Downstream of the vacuum lock 18 for taking out the substrates, a cleaning station 20 is arranged. Such a cleaning station can comprise, for instance, a vacuum cleaner to clean the substrate carrier part 17 by suction.

Further, in the present exemplary embodiment, downstream of the cleaning station 20, two etching stations 20, 21 are provided for cleaning the carrier 4, at least the substrate carrier part 17 thereof, by etching.

FIG. 1 additionally shows a carrier supply and/or discharge station 45 for respectively supplying and discharging carriers 4 into and out of the vacuum space 1 of the assembly. Such a carrier supply and/or discharge station 45 is naturally also provided with an air lock to prevent the vacuum in the vacuum space 1 from being disturbed during the introduction of a carrier 4 into the vacuum space 1.

Figure 12:
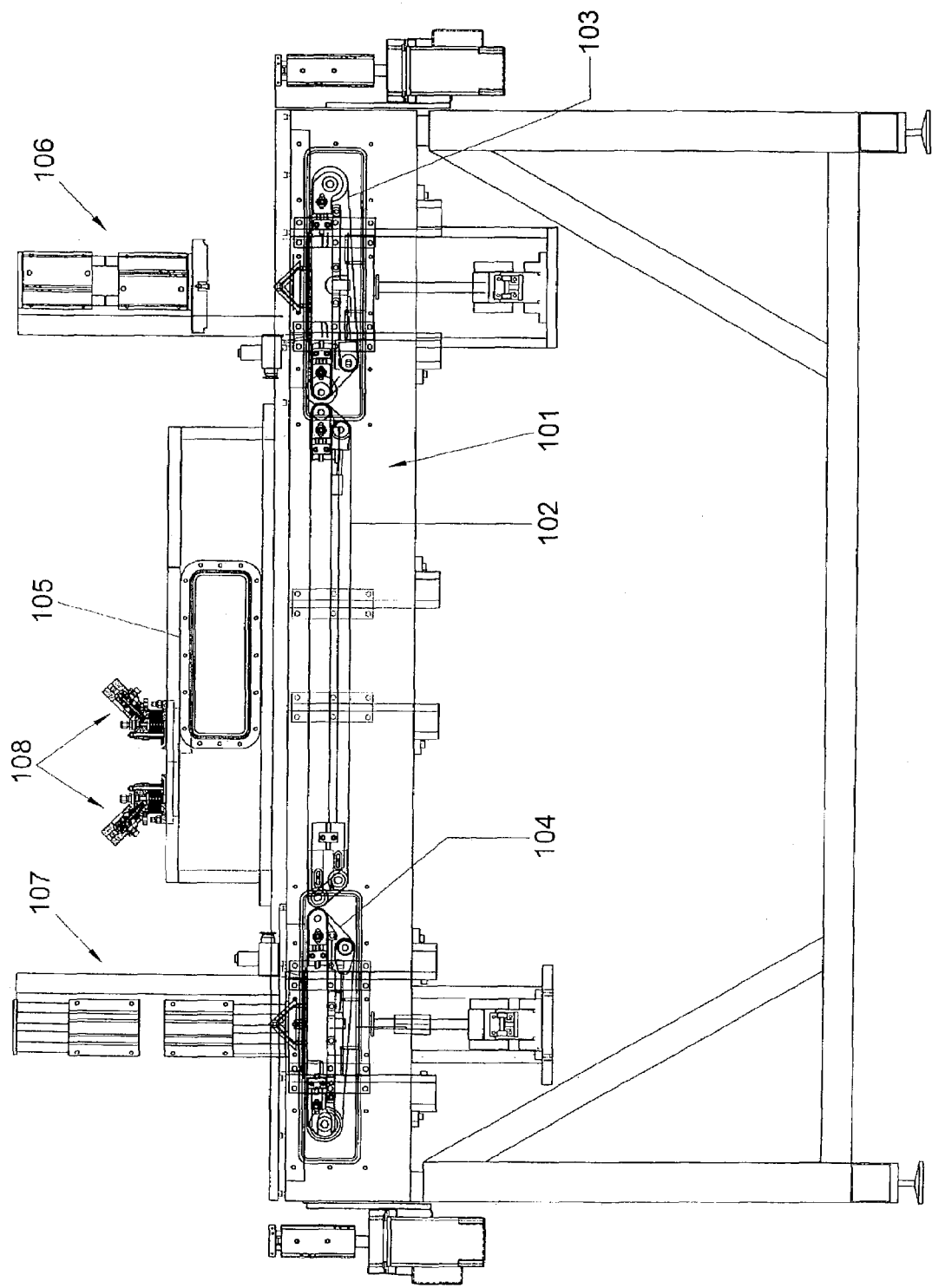
FIG. 12 shows a sectional view of a second exemplary embodiment of the invention.

FIG. 12 shows, in cross section a second exemplary embodiment of an assembly according to the invention. This assembly is likewise provided with a vacuum space 101 in which a conveying device for conveying substrates is disposed. The conveying device comprises an endless main conveyor 102 which has a continuous conveying speed. Upstream of the main conveyor 102, a supply conveyor 103 is arranged which has a downstream end linking up with an upstream end of the main conveyor 102. Arranged downstream of the main conveyor 102 is a discharge conveyor 104 which has an upstream end linking up with a downstream end of the main conveyor 102. The supply conveyor 103 and the discharge conveyor 104 are also arranged in a vacuum space 101. In the present exemplary embodiment, the supply conveyor 103 and the discharge conveyor 104 are endless conveyors which are intermittently drivable. Above the main conveyor 102 a vacuum deposition chamber 105 is arranged. Arranged above the supply conveyor 103 is a vacuum lock 106 for introducing a substrate, and arranged above the discharge conveyor 104 is a vacuum lock 107 for taking out a substrate. The advantage of the endless supply and discharge conveyors is that the conveyor belt thereof can be simply pushed up slightly, with the aid of a movable plate, against the loading opening edge of the vacuum lock 106, 107. In that condition, the vacuum space is closed off from the opening of the respective vacuum lock 106, 107 and the cover can be removed from this opening for placing or removing the substrate. In the present exemplary embodiment, the vacuum deposition takes place with the aid of PECVD sources 108. Naturally, in this exemplary embodiment too, there may be provided means for pre-heating the substrates and means for cooling the substrates. The pre-heating means may, for instance, be integrated into the endless main conveyor 102.

It will be clear that the invention is not limited to the exemplary embodiments described, but that various modifications are possible within the scope of the invention as defined by the claims. Although the carriers in the exemplary embodiment are shown to have a substantially horizontal support surface, it will be clear that embodiments in which the substrates are carried by the carriers in a non-horizontal position, e.g. a vertical or angled position, or are suspended under a carrier also fall within the scope of the invention as defined by the claims. Such alternative positions of the substrates can help to prevent or diminish pollution of the substrates.

It is noted that continuous conveyance should be understood to mean not exclusively conveyance at a constant speed but uninterrupted conveyance. Continuous conveyance may very well involve the speed of the carrier being varied. Naturally, it is also possible that continuous conveyance does proceed at a constant speed.

The invention claimed is:

1. An assembly for processing substrates comprising:
   a conveyor device configured to move a substrate from a vacuum lock to a process chamber, the conveyor device extending in a vacuum space,
   wherein said conveyor device is configured to continuously convey the substrate adjacent the process chamber and to intermittently convey the substrate adjacent the vacuum lock, and
   wherein the conveyor device comprises a plurality of carriers, each carrier comprising a plurality of magnets, and wherein a plurality of stationary coils are arranged outside the vacuum space and are not exposed to the vacuum space, at adjacent positions along which the magnets move, said coils configured to be excited to cause the carriers to advance, and a controller configured to control the exciting of the coils such that a first carrier moves intermittently and at the same time a second carrier moves continuously.

2. An assembly according to claim 1, wherein the conveyor device comprises a rail system, the rail system comprising:
   a plurality of rails extending in the vacuum space,
   said carriers being configured to move over the rails,
   wherein a drive of each carrier is controllable independently of a drive of the other carriers.

3. An assembly according to claim 2, wherein each carrier comprises:
   a base part including a bearing, the bearing supporting the carrier while allowing the carrier to move over the rails,
   an intermediate part connected to the base part, the intermediate part being movable in a direction perpendicular to a support surface of the carrier, and
   a substrate carrier part attached onto the intermediate part with an attachment member, the attachment member forming a thermal insulation between the intermediate part and the substrate carrier part.

4. An assembly according to claim 3, wherein the substrate carrier part comprises a heating element.

5. An assembly according to claim 1, wherein an upstream part of an intermediate part of a carrier is provided with a nose extending substantially over the whole width of the carrier, and a downstream part of the intermediate part is provided with a recess extending substantially over the whole width of the carrier, the recess configured to receive a nose of an intermediate part of a downstream carrier, or vice versa, such that components located under the intermediate parts are screened off.

6. An assembly according to claim 4, further comprising press-up elements engaging the intermediate part of a respective carrier in the vacuum space adjacent discrete positions assumable by the plurality of carriers, the press-up elements being configured to move in a direction perpendicular to a support surface of the carrier by using an energizing mechanism.

7. An assembly according to claim 6, wherein the energizing mechanism comprises a toggle joint lever system arranged outside the vacuum space, and the press-up elements are connected via a bellows with a wall of the vacuum space.

8. An assembly according to claim 2, wherein the conveyor device is configured to intermittently convey the substrate along a first path, the first path of the conveyor device comprising a plurality of discrete positions, and the conveyor device is configured to continuously convey the substrate along a second path.

9. An assembly according to claim 8, wherein the first path has a discharge end and the second path has a supply end, and the discharge end of the first path is connected via a third path to the supply end of the second path.

10. An assembly according to claim 9, wherein the first path has a supply end and the second path has a discharge end, and the discharge end of the second path is connected via a fourth path to the supply end of the first path.

11. An assembly according to claim 10, wherein the third path and/or the fourth path extends perpendicularly to the first path and the second path, the third path and/or the fourth path is provided with cross rails and a cross conveyance carrier, the cross conveyance carrier is configured to place a carrier thereon, and the cross conveyance carrier is provided with rail parts, the rail parts extending perpendicularly to the cross rails and the rail parts can be aligned with the rails of the first and the second path.

12. An assembly according to claim 10,
   wherein the first path includes a vacuum lock for the supply of substrates,
   wherein the third path includes a heater configured to effect a pre-heating of the substrate from the ambient temperature to a temperature of about 300° C.,
   wherein the second path includes a heater configured to effect a pre-heating of the substrate to about 400° C., after the heater the second path includes a plurality of vacuum deposition chambers along which a respective substrate is movable continuously, following the plurality of vacuum deposition chamber, the second and the fourth path include a cooler configured to effect cooling to about 150° C., wherein adjacent a supply end of the first path additional coolers are provided for cooling the substrates further to 60° C., and downstream of the additional coolers a vacuum lock is provided for taking the substrate out of the vacuum space.

13. An assembly according to claim 12, wherein the additional coolers comprise a rinsing device configured to circumfuse the substrate with a gas.

14. An assembly according to claim 12, further comprising a cleaning station disposed downstream of the vacuum lock, the vacuum lock configured for taking out a substrate.

15. An assembly according to claim 14, further comprising an etching station disposed downstream of the cleaning station, said etching station being configured to etch at least a portion of the carrier.

16. An assembly according to claim 2, further comprising a carrier supply and/or a discharge station disposed in the vacuum space, the carrier supply being configured to supply carriers into the vacuum space of the assembly and the discharge station being configured to discharge carriers out of the vacuum space of the assembly.

17. An assembly according to claim 1, wherein a drive of each carrier is controllable independently of a drive of the other carriers.

18. An assembly according to claim 1, wherein the conveyor device comprises a guide system, the guide system comprising:
  a plurality of guides extending in the vacuum space, said carriers being configured to move over the guides,
  wherein a drive of each carrier is controllable independently of a drive of the other carriers.

19. An assembly according to claim 18, wherein the guides include rails and wherein the carriers move over the rails.

20. An assembly according to claim 1, wherein the conveyor device is configured to intermittently convey the substrate along a first path, the first path of the conveyor device comprising a plurality of discrete positions, and the conveyor device is configured to continuously convey the substrate along a second path.

21. An assembly according to claim 1, wherein the first carrier moves intermittently along a first path and at the same time the second carrier moves continuously along a second path.

22. An assembly according to claim 21, wherein the second path extends between two ends of the first path.

23. An assembly according to claim 21, wherein the second path is connected to the first path via a third path and a fourth path.

24. An assembly for processing substrates comprising:
  a conveyor device configured to move a substrate from a vacuum lock to a process chamber, the conveyor device extending in a vacuum space, said conveyor device being configured to continuously convey the substrate adjacent the process chamber and to intermittently convey the substrate adjacent the vacuum lock,
  wherein the conveyor device comprises a rail system, the rail system comprising:
    a plurality of rails extending in the vacuum space,
    a plurality of carriers, said carriers being configured to move over the rails,
    wherein a drive of each carrier is controllable independently of a drive of the other carriers, and each carrier comprises a plurality of magnets, and a plurality of stationary coils are arranged outside the vacuum space, at adjacent positions along which the magnets move, wherein the coils cause the carriers to advance over the rails when the coils are excited,
  a controller configured to control the exciting of the coils such that a first carrier moves intermittently and at the same time a second carrier moves continuously.

25. An assembly according to claim 24, wherein an upstream part of an intermediate part of a respective carrier is provided with a nose extending substantially over the whole width of the carrier, and a downstream part of the intermediate part is provided with a recess extending substantially over the whole width of the carrier, the recess configured to receive a nose of an intermediate part of a downstream carrier, or vice versa, such that components located under the intermediate parts are screened off.

26. An assembly according to claim 24, further comprising press-up elements engaging an intermediate part of a respective carrier in the vacuum space adjacent discrete positions assumable by the plurality of carriers, the press-up elements being configured to move in a direction perpendicular to a support surface of the carrier by using an energizing mechanism.

27. An assembly according to claim 26, wherein the energizing mechanism comprises a toggle joint lever system arranged outside the vacuum space, and the press-up elements are connected via a bellows with a wall of the vacuum space.

28. An assembly according to claim 24, wherein the conveyor device is configured to intermittently convey the substrate along a first path, the first path of the conveyor device comprising a plurality of discrete positions, and the conveyor device is configured to continuously convey the substrate along a second path.

29. An assembly according to claim 28, wherein the first path has a discharge end and the second path has a supply end, and the discharge end of the first path is connected via a third path to the supply end of the second path.

30. An assembly according to claim 29, wherein the first path has a supply end and the second path has a discharge end, and the discharge end of the second path is connected via a fourth path to the supply end of the first path.

31. An assembly according to claim 30, wherein the third path and/or the fourth path extends perpendicularly to the first path and the second path, the third path and/or the fourth path is provided with cross rails and a cross conveyance carrier, the cross conveyance carrier is configured for placing a carrier thereon, and the cross conveyance carrier is provided with rail parts, the rail parts extending perpendicularly to the cross rails and the rail parts can be aligned with the rails of the first and the second path.

32. An assembly according to claim 24, further comprising a cleaning station disposed downstream of the vacuum lock.

33. An assembly according to claim 32, further comprising an etching station disposed downstream of the cleaning station, said etching station being configured to etch at least a portion of the carrier.

34. An assembly according to claim 24, further comprising a carrier supply anchor a discharge station disposed in the vacuum space, the carrier supply being configured to supply carriers into the vacuum space of the assembly and the discharge station being configured to discharge carriers out of the vacuum space of the assembly.

35. An assembly for processing substrates comprising:
a conveyor device configured to move a substrate from a vacuum lock to a process chamber, the conveyor device extending in a vacuum space, the conveyor device being configured to continuously convey the substrate adjacent the process chamber and to intermittently convey the substrate adjacent the vacuum lock,
wherein the conveyor device comprises a rail system, the rail system comprising:
a plurality of rails extending in the vacuum space,
a plurality of carriers, said carriers being configured to move over the rails, a drive of each carrier is controllable independently of a drive of the other carriers,
wherein each carrier comprises:
a base part including a bearing, the bearing supporting the carrier while allowing the carrier to move,
an intermediate part connected to the base part, the intermediate part being movable in vertical direction, and
a substrate carrier part attached onto the intermediate part with an attachment member, the attachment member forming a thermal insulation between the intermediate part and the substrate carrier part.

36. An assembly according to claim 35, wherein the substrate carrier part comprises a heating element.

37. An assembly according to claim 35, wherein an upstream part of the intermediate part is provided with a nose, and a downstream part of the intermediate part is provided with a recess, the recess configured to receive a nose of an intermediate part of a downstream carrier, or vice versa, such that components located under the intermediate parts are screened off.

38. An assembly according to claim 35, further comprising press-up elements engaging the intermediate part of a respective carrier in the vacuum space adjacent discrete positions assumable by the plurality of carriers, the press-up elements being configured to move vertically by using an energizing mechanism.

39. An assembly according to claim 38, wherein the energizing mechanism comprises a toggle joint lever system arranged outside the vacuum space, and the press-up elements are connected via a bellows with a bottom wall of the vacuum space.

40. An assembly according to claim 35, wherein the conveyor device is configured to intermittently convey the substrate along a first path, the first path of the conveyor device comprising a plurality of discrete positions, and the conveyor device is configured to continuously convey the substrate along a second path.

41. An assembly according to claim 40, wherein the first path has a discharge end and the second path has a supply end, and the discharge end of the first path is connected via a third path to the supply end of the second path.

42. An assembly according to claim 41, wherein the first path has a supply end and the second path has a discharge end, and the discharge end of the second path is connected via a fourth path to the supply end of the first path.

43. An assembly according to claim 42, wherein the third path and/or the fourth path extends perpendicularly to the first path and the second path, the third path and/or the fourth path is provided with cross rails and a cross conveyance carrier, the cross conveyance carrier is configured for placing a carrier thereon, and the cross conveyance carrier is provided with rail parts, the rail parts extending perpendicularly to the cross rails and the rail parts can be aligned with the rails of the first and the second path.

44. An assembly according to claim 35, further comprising a cleaning station disposed downstream of the vacuum lock.

45. An assembly according to claim 44, further comprising an etching station disposed downstream of the cleaning station, said etching station being configured to etch at least a portion of the carrier.

46. An assembly according to claim 35, further comprising a carrier supply and/or a discharge station disposed in the vacuum space, the carrier supply being configured to supply carriers into the vacuum space of the assembly and the discharge station being configured to discharge carriers out of the vacuum space of the assembly.

47. An assembly for processing substrates comprising:
a conveyor device configured to move a substrate from a vacuum lock to a process chamber, the conveyor device extending in a vacuum space, said conveyor device being configured to intermittently convey the substrate adjacent the vacuum lock along a first path, the first path of the conveyor device comprising a plurality of discrete positions, and to continuously convey the substrate adjacent the process chamber along a second path,
wherein the conveyor device comprises a rail system, the rail system comprising:
a plurality of rails extending in the vacuum space,
a plurality of carriers, said carriers being configured to move over the rails, and a drive of each carrier is controllable independently of a drive of the other carriers,
wherein the first path has a discharge end and the second path has a supply end, and the discharge end of the first path is connected via a third path to the supply end of the second path,
wherein the first path has a supply end and the second path has a discharge end, and the discharge end of the second path is connected via a fourth path to the supply end of the first path,
wherein the first path includes a vacuum lock for the supply of substrates,
wherein the third path includes a heater configured to effect a pre-heating of the substrate from the ambient temperature to a temperature of about 300° C.,
wherein the second path includes a heater configured to effect a pre-heating of the substrate to about 400° C., after the heater the second path includes a plurality of vacuum deposition chambers along which a respective substrate is movable continuously, following the plurality of vacuum deposition chamber, the second and the fourth path include a cooler configured to effect cooling to about 150° C., and
wherein adjacent a supply end of the first path additional coolers are provided for cooling the substrates further to 60° C., and downstream of the additional coolers a vacuum lock is provided for taking the substrate out of the vacuum space.

48. An assembly according to claim 47, wherein the additional coolers comprise a rinsing device configured to circumfuse the substrate with a gas.

49. An assembly according to claim 47, further comprising a cleaning station disposed downstream of the vacuum lock, the vacuum lock configured for taking out a substrate.

50. An assembly according to claim 49, further comprising an etching station disposed downstream of the cleaning station, said etching station being configured to etch at least a portion of the carrier.

51. An assembly according to claim 47, wherein an upstream part of an intermediate part of a carrier is provided with a nose, and a downstream part of the intermediate part is provided with a recess, the recess configured to receive a nose of an intermediate part of a downstream carrier, or vice versa, such that components located under the intermediate parts are screened off.

52. An assembly according to claim 47, further comprising press-up elements engaging the intermediate part of a respective carrier in the vacuum space adjacent discrete positions assumable by the plurality of carriers, the press-up elements being configured to move vertically by using an energizing mechanism.

53. An assembly according to claim 52, wherein the energizing mechanism comprises a toggle joint lever system arranged outside the vacuum space, and the press-up elements are connected via a bellows with a bottom wall of the vacuum space.

54. An assembly according to claim 47, wherein the third path and/or the fourth path extends perpendicularly to the first path and the second path, the third path and/or the fourth path is provided with cross rails and a cross conveyance carrier, the cross conveyance carrier is configured for placing a carrier thereon, and the cross conveyance carrier is provided with rail parts, the rail parts extending perpendicularly to the cross rails and the rail parts can be aligned with the rails of the first and the second path.

55. An assembly according to claim 47, further comprising a carrier supply and/or a discharge station disposed in the vacuum space, the carrier supply being configured to supply carriers into the vacuum space of the assembly and the discharge station being configured to discharge carriers out of the vacuum space of the assembly.

* * * * *